United States Patent
Boselli et al.

(10) Patent No.: US 8,530,301 B2
(45) Date of Patent: Sep. 10, 2013

(54) MOS DEVICE WITH SUBSTRATE POTENTIAL ELEVATION FOR ESD PROTECTION

(75) Inventors: Gianluca Boselli, Plano, TX (US); Charvaka Duvvury, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 522 days.

(21) Appl. No.: 12/951,255

(22) Filed: Nov. 22, 2010

(65) Prior Publication Data
US 2011/0063765 A1    Mar. 17, 2011

Related U.S. Application Data

(62) Division of application No. 12/108,230, filed on Apr. 23, 2008, now Pat. No. 7,838,924.

(51) Int. Cl.
*H01L 21/8238* (2006.01)
(52) U.S. Cl.
USPC ........... 438/212; 257/355; 257/546; 257/328; 438/268
(58) Field of Classification Search
USPC .................. 257/355, 328, 546; 438/212, 268
See application file for complete search history.

(56) References Cited

U.S. PATENT DOCUMENTS

| | | | | |
|---|---|---|---|---|
| 6,624,487 B1 * | 9/2003 | Kunz et al. | | 257/409 |
| 6,696,708 B2 * | 2/2004 | Hou et al. | | 257/173 |
| 6,713,841 B2 * | 3/2004 | Gossner | | 257/546 |
| 7,282,767 B2 * | 10/2007 | Duvvury et al. | | 257/355 |
| 2008/0067615 A1 * | 3/2008 | Kim | | 257/408 |

* cited by examiner

*Primary Examiner* — Yu-Hsi D Sun
(74) *Attorney, Agent, or Firm* — Warren L. Franz; Wade J. Brady, III; Frederick J. Telecky, Jr.

(57) ABSTRACT

An integrated circuit (25) formed at a semiconducting surface of a substrate including a common p-layer (38) includes functional circuitry (24) formed on the p-layer (38) including a plurality of terminals (IN, OUT, I/O) coupled to the functional circuitry (24). At least one ESD protection cell (30; in more detail 200) is connected to at least one of the plurality of terminals of the functional circuitry (24). The protection cell includes at least a first Nwell (37) formed in the p-layer (38), a p-doped diffusion (36) within the first Nwell (37) to form at least one Nwell diode comprising an anode (37) and a cathode (36). An NMOS transistor 200 is formed in or on the p-layer (38) comprising a n+ source (43), n+ drain (44) and a channel region comprising a p-region (41) between the source and drain, and a gate electrode (45) on a gate dielectric (46) on the channel region. The terminal of the functional circuit (24, PAD) is coupled to the cathode (36) of the Nwell diode, and the anode (37) of the Nwell diode is connected in series with a path from the drain (44) to the source (43) of the NMOS transistor (200).

5 Claims, 6 Drawing Sheets

MOS DEVICE WITH SUBSTRATE POTENTIAL ELEVATION FOR ESD PROTECTION

This application is a division of prior application Ser. No. 12/108,230, filed Apr. 23, 2008, the entirety of which is hereby incorporated by reference.

BACKGROUND

This invention is in the field of semiconductor integrated circuits, and is more specifically directed to integrated circuits having electrostatic discharge (ESD) protection circuitry and techniques for protecting integrated circuits from damage caused by electrostatic discharge events.

Modern high-density integrated circuits (ICs) are known to be vulnerable to damage from the electrostatic discharge (ESD) of a charged body. ESD damage occurs when the amount of charge exceeds the capability of the conduction path through the integrated circuit. In the MOS transistor context, the typical ESD failure mechanisms include thermal runaway resulting in junction shorting, and dielectric breakdown resulting in gate-junction shorting.

To avoid damage from ESD, modern integrated circuits may incorporate ESD protection devices at each external terminal (viz., pin pad). ESD protection devices generally operate by providing a high current capacity conduction path, so that a brief but massive ESD event may be safely conducted away from vulnerable. In some cases, ESD protection is inherent to the particular terminal, as in the case of a power supply terminal which may provide an extremely large p-n junction capable of conducting the ESD charge. Input/output (I/O) terminals, on the other hand, typically have separate ESD protection devices added in parallel to the functional terminals. The ideal ESD protection device turns on quickly in response to an ESD event, with large conduction capability, but remains off and presents no significant load during normal operation.

The high operating voltage and failsafe design constraints have generally been addressed through the use of drain-extended MOS transistors (referred to as DeMOS transistors, or DeNMOS transistors in the case of n-channel DeMOS devices). A conventional drain-extended transistor has its drain region located within a well of the same conductivity type; for example, in the n-channel case, the n-type drain region is placed within a relatively lightly-doped n-type well. The increased drain-to-substrate junction area provided by the well, along with the reduced dopant concentration at the drain-to-substrate junction, greatly increases the junction breakdown voltage, permitting high voltage operation of the transistor while tolerating voltage excursions at the drain that can occur in the absence of a clamp. DeMOS transistors also enable the use of thinner gate dielectric (e.g. oxide) because the voltage drop across the depletion region of the well reduces the electric field at the drain-side edge of the gate dielectric, and thus reduces the number of channel "hot" carriers that are produced. This reduction in "hot" carrier effects, specifically threshold voltage shift, enables the construction of reliable transistors with extremely thin gate dielectrics. DeMOS devices also present high output impedance, which is especially attractive in using the device in analog circuits. DeMOS transistors are therefore very attractive for use at input/output (I/O) terminals of modern integrated circuits.

It has been observed, however, that DeMOS devices themselves provide relatively poor inherent ESD protection. One mode of operation for ESD protection structures comprises the elevation of the substrate potential (e.g. to achieve $V_{SUB}>1V$) during ESD conditions. This substrate bias improves the response of the ESD protection device, while not generally affecting normal operation of the integrated circuit being protected.

In one known substrate elevation embodiment, the ESD cell comprises an NMOS transistor and an RC-triggered pump transistor which is operable to raise the substrate potential of the NMOS transistor during ESD events by forcing current directly into the floating substrate. In another substrate elevation arrangement, the ESD cell comprises an NMOS transistor and an Nwell diode connected to the supply line. When an ESD event strikes this cell, the charging of the supply capacitance forces substrate current from the parasitic pnp embedded in the Nwell diode into the NMOS substrate, thus raising the substrate potential.

However, known ESD protection structures are subject to deficiencies, such as: relatively large circuit area required; full protection for only a portion (e.g. beginning) of the ESD pulse; lack applicability to failsafe applications (e.g. a direct DC path to the power supply is not available); significant capacitive loading; and need for extra biasing circuit or connections.

What is needed is a new ESD protection structure and method of protecting functional circuitry against ESD induced damage that eliminates or reduces the deficiencies listed above.

SUMMARY

This Summary is provided to briefly indicate the nature and substance of the invention and should not be used to interpret or limit the scope or meaning of the claims.

Described embodiments of the invention generally comprise an ESD protection cell including at least one Nwell diode (and in one embodiment a plurality of series connected Nwell diodes) in series with a drain-to-source path of an NMOS transistor. Embodiments of the invention are generally operable using the Nwell diode's parasitic pnp bipolar action (the Nwell is the base and p-substrate or p-surface layer is the collector of the parasitic pnp transistor) in series with the drain-to-source path of the NMOS transistor, to receive the collector current and direct the substrate current to provide p-substrate or p-surface layer potential elevation. The pad from the terminal of the functional circuit to be protected (e.g., I/O, dedicated IN or dedicated OUT) is generally connected to the anode of the Nwell diode, or to the anode of the first of the Nwell diodes in the case there are a plurality of series connected Nwell diodes. The NMOS transistor can be a DeNMOS transistor.

During an ESD event, the main ESD discharge current is generally conducted by the Nwell diode. Due to transistor action of the parasitic pnp transistor comprising the Nwell diode, a current related to the ESD current will pass into the common p-substrate or p-surface layer, thus raising the local p-substrate or p-surface layer potential of the ESD cell.

The NMOS transistor can comprise a DeNMOS transistor, wherein the channel region further comprises a second Nwell. In one embodiment, the n+ source and p-region are connected to one another and tied to Vss. In this embodiment the gate electrode can be connected to the n+ source and the p-region.

In another embodiment, a single contiguous Nwell provides both the Nwell for the Nwell diode and the Nwell for the drain of the NMOS transistor. The ESD cell can further comprise a guard ring surrounding the Nwell diode and the NMOS transistor. In one embodiment, the guard ring is closer to the NMOS transistor than the Nwell diode. The Nwell diode can be oriented primarily perpendicular with respect to the path from the drain to the source of the NMOS transistor.

DESCRIPTION OF THE DRAWINGS

The present invention is described with reference to the attached figures, wherein like reference numerals are used throughout the figures to designate similar or equivalent elements. The figures are not drawn to scale and they are provided merely to illustrate the instant invention.

DETAILED DESCRIPTION

Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, details of well-known structures or operations are omitted to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

An integrated circuit formed at a semiconductor surface of a substrate comprises a common p-type conductivity layer ("p-layer"), functional circuitry formed on the p-layer having a plurality of terminals coupled to the functional circuitry, and at least one ESD protection cell connected to at least one of the plurality of terminals in parallel with the functional circuitry. The substrate itself can provide the common p-layer, or the p-layer may be provided otherwise, such as in an epitaxial arrangement with an underlying substrate. The protection cell comprises at least a first Nwell formed in the p-layer, a p-doped diffusion within the first Nwell to form at least one Nwell diode comprising an anode and a cathode, wherein the terminal of the functional circuit to be protected is coupled to the anode of the Nwell diode. An NMOS transistor formed on the p-layer comprises an n+ source, an n+ drain and a channel region comprising a p- region between the source and drain, and a gate electrode on a gate dielectric on the channel region.

The Nwell diode is connected in series with the path from the drain to the source of the NMOS transistor. In certain embodiments of the invention, the NMOS transistor can comprise a DeNMOS transistor. Moreover, the NMOS transistor can comprise a plurality of NMOS transistors connected in parallel.

Figure 1:
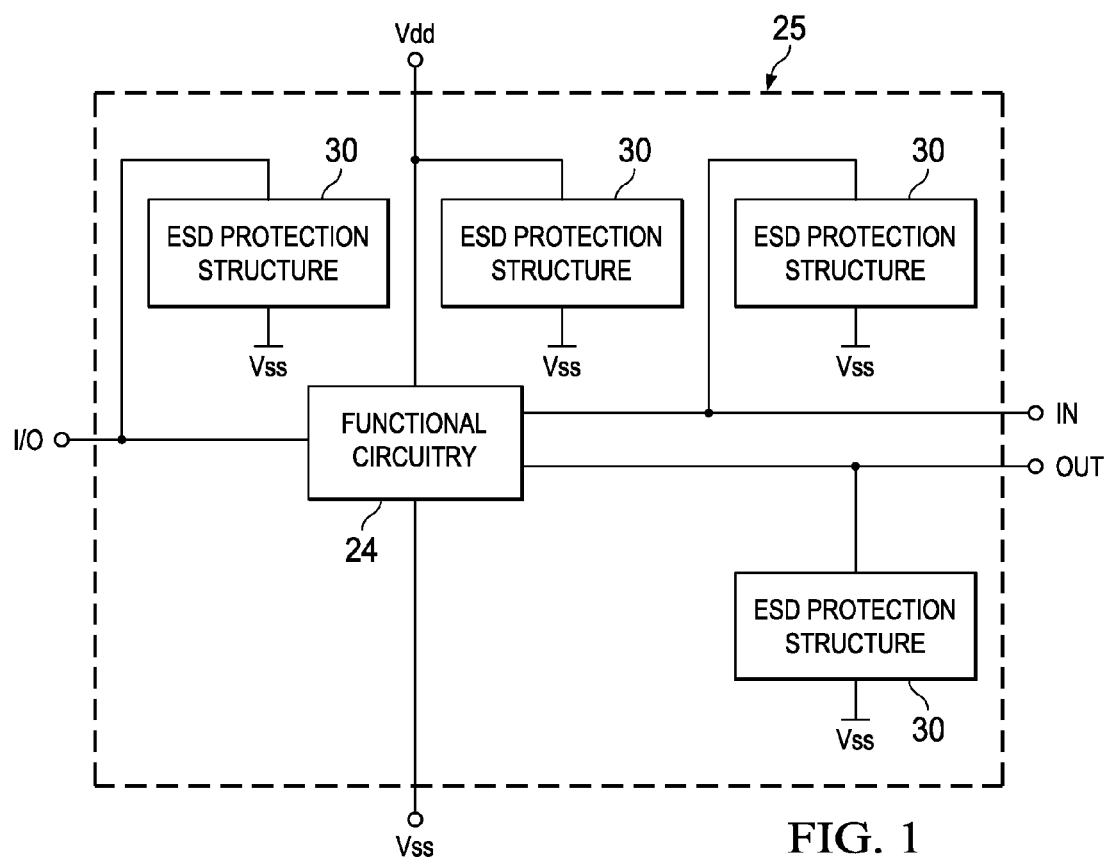
FIG. 1 is a block diagram of an integrated circuit into which embodiments of the invention may be incorporated.

FIG. 1 illustrates an integrated circuit 25 into which embodiments of the invention may be incorporated. Integrated circuit 25 includes functional circuitry 24, which is the circuitry that realizes and carries out the desired functionality of integrated circuit 25. The capability of functional circuitry 24 may vary widely, for example ranging from a simple buffer or interface on the one hand, to a complex programmable device such as a digital signal processor (DSP) on the other. The specific type of functionality contained within functional circuitry 24 does not matter for consideration of embodiments of the invention.

Integrated circuit 25 also includes a number of external terminals, by way of which functional circuitry 24 carries out its function. A few of those external terminals are illustrated in FIG. 1 by way of example. It is to be understood that the number of terminals and their function can also vary widely (up to on the order of several hundred terminals in some cases). In the example of FIG. 1, an I/O terminal operates as a common input and output terminal, by way of which functional circuitry 24 can receive incoming signals and can deliver output signals, as known in the art. A dedicated input terminal IN is also shown in FIG. 1 for integrated circuit 25, as is a dedicated output terminal OUT; terminals IN, OUT are also connected to functional circuitry 24. A power supply terminal Vdd receives a positive power supply voltage in this example, while a negative power supply terminal Vss is provided to receive a reference voltage, such as system ground.

According to the certain embodiments of the invention, integrated circuit 25 includes an ESD protection structure 30 connected to each of its terminals shown in FIG. 1. As shown in FIG. 1, each ESD protection structure 30 is connected between a terminal of functional circuit 24 and Vss (e.g. ground), thus being in parallel with the functional circuitry 24. As will be evident from the following description, ESD protection structure 30 is well-suited for a wide range of terminals, including power supply terminals that are required to have low input impedance. It is noted that except for protection of power supplies, ESD protection structures 30 may receive their high voltage input via connection to a terminal of integrated functional circuitry 24, and not Vdd. This aspect of embodiments of the invention provides applicability to failsafe connections in which a DC path to the Vdd supply is not available.

Figure 2:
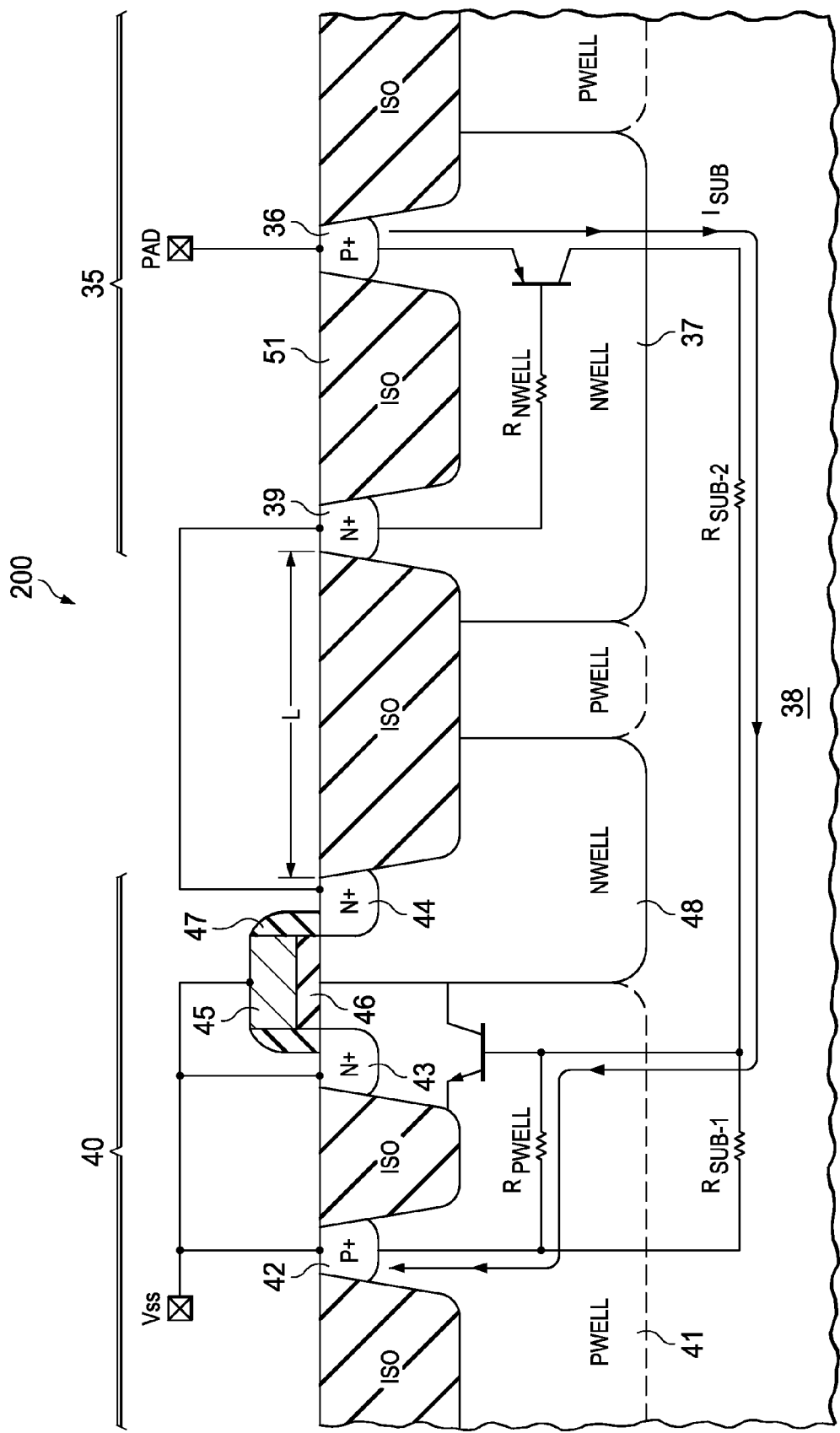
FIG. 2 shows a cross-sectional view of an ESD protection structure according to an embodiment of the invention.

FIG. 2 shows an ESD protection structure 200 according to a first embodiment of the invention. The parasitic bipolar and resistances in the semiconductor regions of interest are also shown, as well as the path of the substrate current ($I_{SUB}$) that flows from the Nwell diode to the NMOS transistor during an ESD event. In this embodiment, the series Nwell diode is in an Nwell separate from the Nwell used by the NMOS transistor. ESD structure 30 comprises a vertical pnp bipolar transistor 35 comprising p+ emitter/anode 36, Nwell base/cathode 37 and p-substrate 38. An n+ contact 39 is shown to Nwell 37.

DeNMOS transistor 40 comprises Pwell/p-body 41, p+ contact 42 to Pwell/p-body 41, n+ source 43, n+ drain 44, Nwell 48, gate electrode 45 and gate dielectric 46. A spacer 47 is shown on the sidewall of the gate 45/46. An n+ drain 44 contact region is located in Nwell 48. The n+ drain 44 is shown directly connected to Nwell 37 through a connection to n+ contact 39, such as by a metal layer (shown schematically in FIG. 2). Shallow trench isolation (STI) isolation ("ISO")

regions 51 are shown for providing isolation between respective terminals. Other isolation schemes (e.g., dielectric isolation) and processes (e.g., LOCOS) may also be used. The distance between n+ drain 44 and n+ contact 39 is shown as L.

Gate electrode 45 is shown (schematically) optionally coupled (e.g., using metal) to source 43 and p-body 41 via p+ contact 42. Power supply terminal Vss is shown coupled to gate electrode 45, n+ source 43 and Pwell/p-body 41. Although gate electrode 45 can be generally driven at any potential, gate electrode 45 is grounded in the shown embodiment for ease of design. The pad to be protected ("PAD") is shown in FIG. 2 connected to p+ emitter/anode 36. As described above, the connection shown schematically from the pad PAD is a connection from the functional circuitry terminal to be protected (e.g., I/O, dedicated IN or dedicated OUT terminal).

Figure 3:
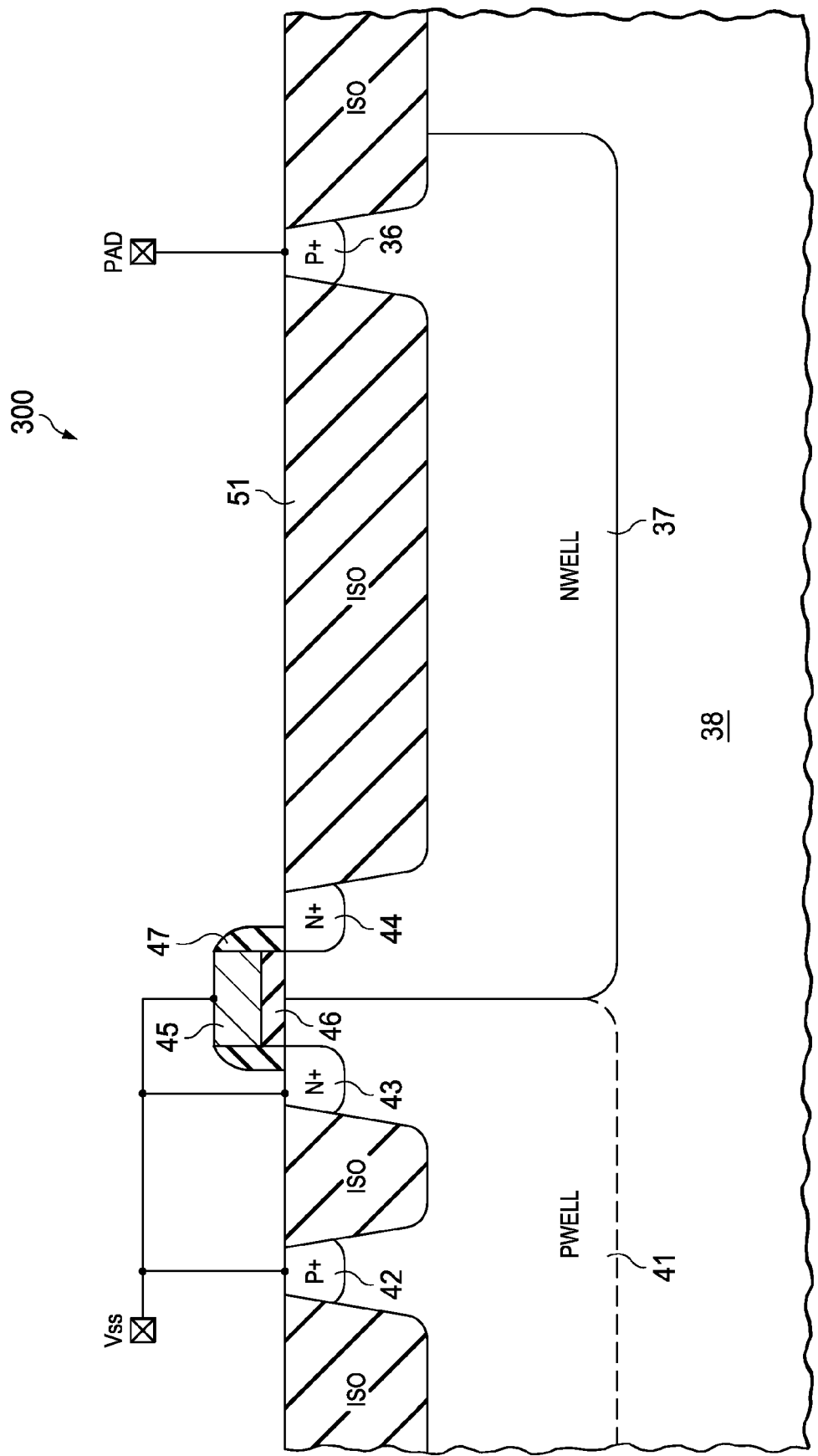
FIG. 3 shows a cross-sectional view of an ESD protection structure according to another embodiment of the invention.

FIG. 3 shows an ESD protection structure 300 according to another embodiment of the invention. In this embodiment, the series Nwell diode is embedded in the same Nwell used by the NMOS transistor. Thus, the distance L shown in FIG. 2 becomes zero, and the n+ drain 44 is also used as the n+ contact for Nwell 37. Otherwise, ESD structure 300 is analogous to ESD structure 200 shown in FIG. 2.

Figure 4:
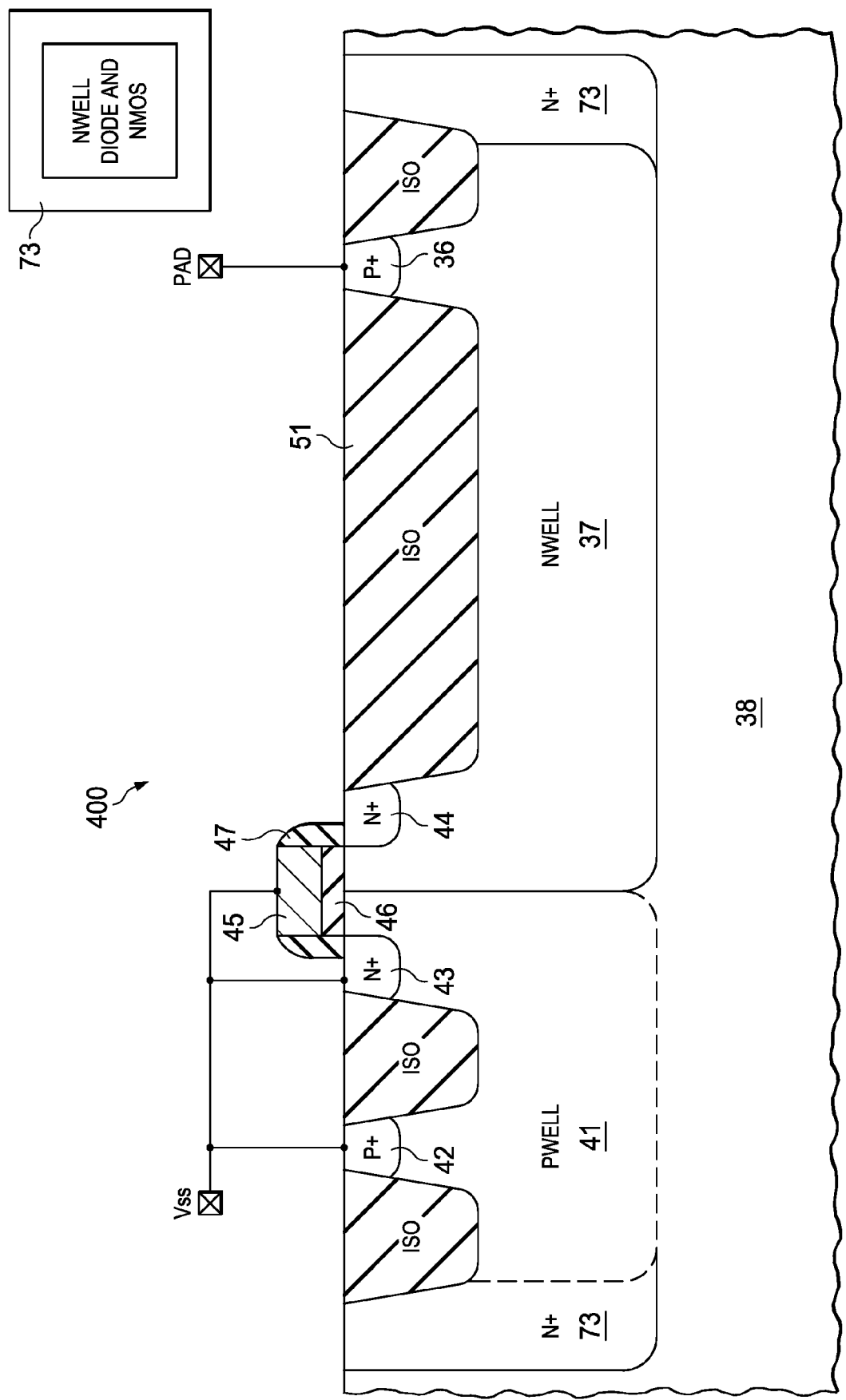
FIG. 4 shows a cross-sectional and a simplified schematic top view of an ESD protection structure according to another embodiment of the invention.

FIG. 4 shows an ESD protection structure 400 according to another embodiment of the invention. In this embodiment, an N+/Nwell guard ring 73 is added to enclose a previously described ESD protection structure, such as structure 200 or 300, to eliminate or at least minimize the amount of substrate current flow to any other p+ substrate connection outside the ESD cell. The guard ring 73 encloses the entire perimeter of the Nwell diode and NMOS transistor and thus ensures that essentially all the substrate current generated by the series Nwell diode is collected by the substrate associated with the NMOS transistor.

Figure 5A:
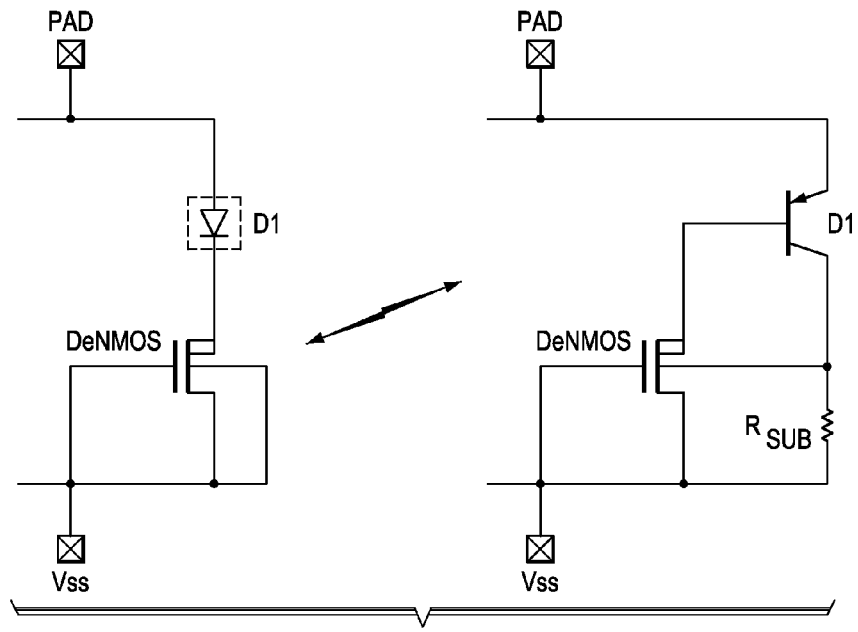
FIG. 5A shows simplified electrically equivalent circuits derived from the ESD structures shown in FIGS. 2-4. The Nwell series diode is shown as D1.

FIG. 5A shows simplified electrically equivalent circuits derived from ESD structures 200, 300, or 400. As noted above, the emitter/anode is connected to the pad PAD which is coupled to the functional circuit terminal to be protected (e.g., I/O, dedicated IN or Dedicated OUT terminal). The Nwell series diode or the vertical pnp transistor that comprises the Nwell series diode is shown as Dl. The circuit at the right highlights the parasitics (vertical pnp transistor action embedded in diode D1 and the parasitic substrate resistance $R_{SUB}$) which are generally fundamental to the operation of embodiments of the invention.

Figure 5B:
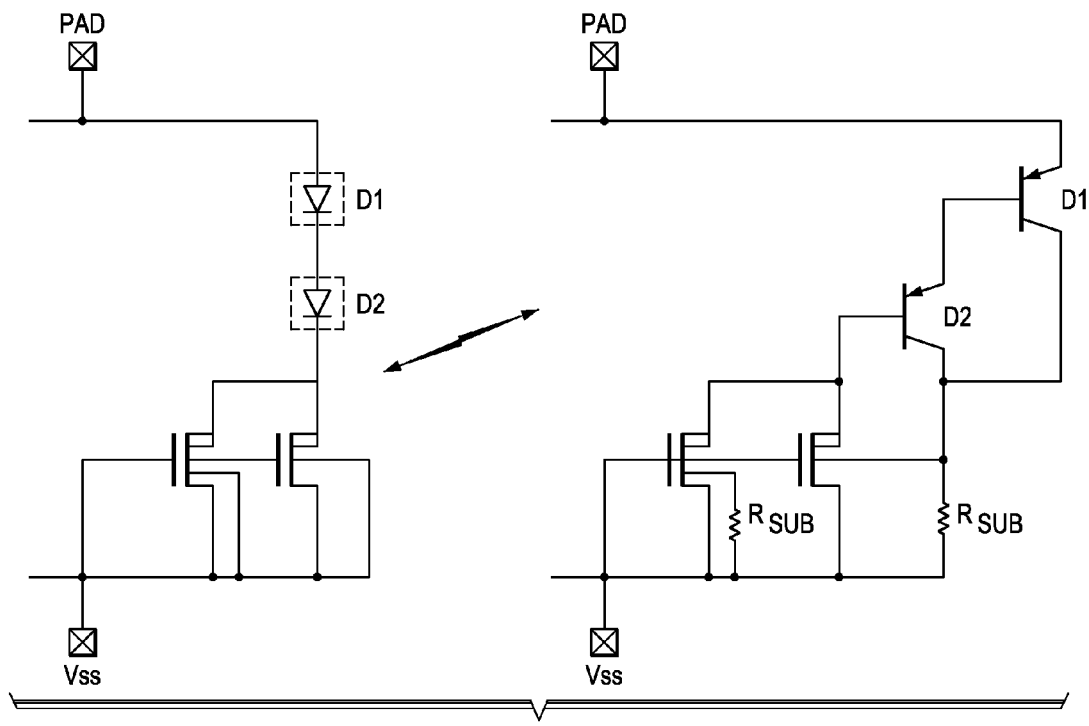
FIG. 5B shows simplified electrically equivalent circuits derived from the ESD structures shown in FIGS. 2-4 modified to have Nwell diodes (D1 and D2)connected in series and NMOS transistors connected in parallel.

FIG. 5B shows simplified electrically equivalent circuits derived from the ESD structures shown in FIGS. 2-4, modified to have the Nwell diode realized by series connected Nwell diodes (D1 and D2) and to have the NMOS transistor realized by NMOS transistors connected in parallel. Two or more series connected Nwell diodes generally provide extra voltage drop to accommodate higher voltage applications and extra substrate current due to the plurality of Nwell diodes (hence vertical pnp bipolar transistors) as compared to the single Nwell diode embodiments shown in FIGS. 2-4. In the embodiment with two or more series connected Nwell diodes, one but not all of the diodes can be implemented with "diode connected" NMOS transistors. In this embodiment, better substrate elevation performance is generally provided by having the diode connected to the pad PAD be an Nwell diode (and thus contribute substrate current).

The parallel connected transistors are helpful, particularly when the transistor area is large. Larger perimeter ESD structures (e.g., with total width Wtot from 100 μm to 2000 μm) are generally arranged in multi-finger configurations, i.e., with a plurality of individual protection transistors connected in parallel.

In addition, the NMOS transistor can comprise a plurality of NMOS transistors configured in a cascoded arrangement. The cascoded arrangement increases high voltage tolerance of the ESD cell, and can be used in combination with the two or more series connected Nwell diodes described above to accommodate even higher voltage applications.

Figure 6:
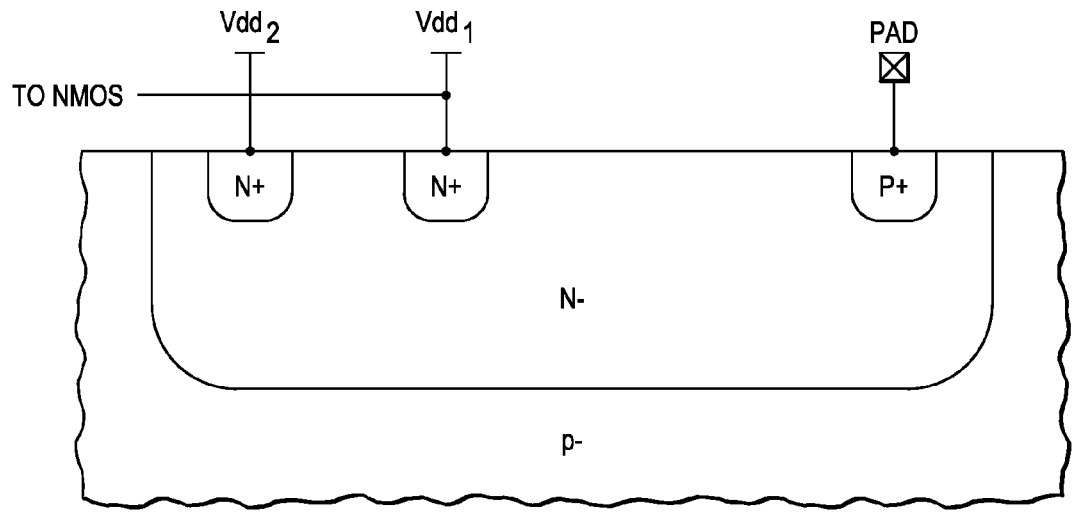
FIG. 6 shows an Nwell diode bias arrangement according to an embodiment of the invention that can be used to reduce leakage.

Certain biasing arrangements can improve performance of ESD cells according to embodiments of the invention. For example, to reduce leakage, as shown in the biasing arrangement 600 shown in FIG. 6, the Nwell diode can be biased with $Vdd_2 > Vdd_1$. In this arrangement, $Vdd_2$ and $Vdd_1$ may, for example, be 12 V and 5 V, respectively.

The amount of substrate potential elevation provided by embodiments of the invention generally depends on several design parameters. The orientation of Nwell diode with respect to the drain-to-source path of the NMOS transistor is one design parameter, wherein a better elevation generally results from a primarily perpendicular orientation. A larger elevation is generally achieved for a shorter distance L of the Nwell diode to the NMOS transistor, which can be <10 μm and include the embodiment shown in FIG. 3 where the distance is zero. In addition, having a farther connection from p+ emitter/anode 36 to the NMOS transistor provides a higher substrate resistance $R_{SUB}$, which then requires lower substrate current $I_{SUB}$ for a given target voltage $V_{SUB}$. Moreover, enclosing substantially the entire ESD protection cell within an n+/Nwell guard ring (such as shown using N+/Nwell guard ring 73 in FIG. 4) ensures that essentially all of the substrate current $I_{SUB}$ generated will be collected by the substrate resistance $R_{SUB}$.

Embodiments of the invention can generally be applied to all NMOS-based ESD protection structures that can benefit from substrate elevation during ESD events. With regard to circuit implementation, an ESD cell according to an embodiment of the invention comprising an Nwell diode series with the source-to-drain path of a DeNMOS transistor is used in a high-voltage cell. Embodiments of the invention are generally suitable for any failsafe application (i.e., where a path to the power supply is not available). Accordingly, the protected circuit can generally be any open-output buffer (single/cascoded NMOS/PMOS to ground), or any supply pad.

Figure 7:
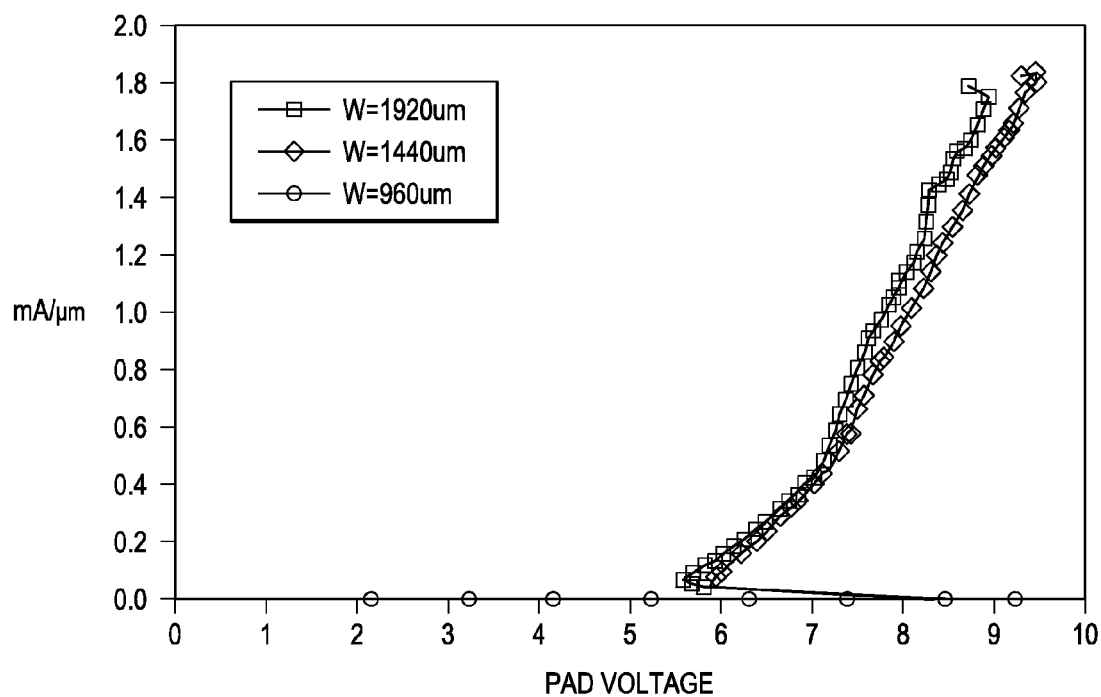
FIG. 7 is a graphical representation of normalized pad current (mA/μm) vs. pad voltage as a function of width (W) achieved by an ESD structure according to an embodiment of the invention.

Embodiments of the invention provide significant advantages. For example, significant chip area is saved compared to conventional substrate elevating techniques, estimated as generally being about 40%. Moreover, the substrate current generated by the Nwell diode is generally applied for the entire duration of the ESD pulse. As described above, embodiments of the invention allow failsafe applications (when no DC path to supply is available). Moreover, a low-capacitance solution (e.g., <200 pF) is generally provided because the Nwell diode in series "shields" the actual capacitance of the large DeNMOS transistor. Moreover, the comparatively large MOS transistor, such as a DeNMOS transistor, can be in grounded gate configuration (such as shown in FIGS. 2 and 3), with no need for any extra biasing circuit. The series Nwell diode also reduces leakage from the NMOS transistor due to the series diode voltage drop. Examples FIG. 7 shows a plot of pad current (mA/μm) vs. pad voltage (V) as a function of width W (μm) of the NMOS transistor. The provided pad current allows elevation of the substrate potential of generally >1 V during ESD conditions to restore a level of ESD robustness with generally achievable failure current levels (the current at which thermal runaway is initiated) $I_{T2} > 2mA/\mu m$. The data provided demonstrates the scalability (i.e., effectiveness) of embodiments of the invention. Scalability to a large width is generally a significant consideration in designing effective ESD cells.

According to embodiments of the invention, ESD protection is provided for integrated circuits utilizing NMOS transistors including drain-extended MOS transistors. This protection is provided without requiring the masking or other elimination of isolation structures, such as shallow trench isolation structures, and is also compatible with other advanced technologies such as silicide-clad diffusions. In addition, as described above, the ESD protection structures according to this invention provide improved ESD protection performance over conventional structures, including higher failure current levels $I_{T2}$. The implementation of these inventive structures is compatible with failsafe requirements, and may also be used in connection with low impedance terminals such as power supply terminals.

Although the example devices described above are configured as n-type MOS transistors, the invention also includes devices that are configured as p-type MOS transistors or combinations of n-type or p-type transistors. One of ordinary skill in the art would understand how to fabricate p-type transistors in accordance with the invention, e.g., by inverting the conductivity type of dopants, as compared to the conductivity types shown in the figures.

The semiconductor substrates may include various elements therein and/or layers thereon. These can include barrier layers, other dielectric layers, device structures, active elements and passive elements including source regions, drain regions, bit lines, bases, emitters, collectors, conductive lines, conductive vias, etc. Moreover, the invention can be based on a variety of processes including CMOS and BiCMOS processes.

While various embodiments of the present invention have been described above, it should be understood that they have been presented by way of example only, and not by way of limitation. Numerous changes to the disclosed embodiments can be made in accordance with the disclosure herein without departing from the spirit or scope of the invention as defined in the claims and their equivalents.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated example implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and/or in the claims, such terms are intended to be inclusive in a manner similar to the term "comprising."

What is claimed is:

1. A method of protecting an integrated circuit from an electrostatic discharge (ESD) event, said integrated circuit comprising a functional circuit and an ESD protection cell connected to a terminal of said functional circuit, said functional circuit and said ESD circuit formed in or on a substrate having a p type layer;

said protection cell comprising an Nwell formed in said p type layer, a p doped region formed in said Nwell defining with said Nwell an Nwell diode comprising an anode and a cathode, and a DeNMOS transistor formed in or on said p type layer comprising an n type source, an n type drain formed within said Nwell and a channel region comprising said Nwell and a p type region between said source and said drain, wherein said terminal is coupled to said p doped region defining said Nwell diode and said Nwell diode is connected in series with a current path from said drain to said source of said DeNMOS transistor;

and said method comprising:

said terminal and said p doped region of said Nwell diode receiving an electrostatic discharge during said ESD event; and said Nwell diode generating an ESD discharge current responsive to said ESD event, wherein a current related to said ESD discharge current flows into said p type layer raising a local potential of said p type layer proximate to said protection cell.

2. The method of claim 1, wherein said raising a local potential of said p type layer proximate to said protection cell is maintained during an entire duration of said ESD event.

3. The method of claim 1, wherein said n type source and said p type region are connected to one another and tied to Vss.

4. The method of claim 3, wherein a gate electrode of said DeNMOS transistor is connected to said source and said p type region.

5. The method of claim 1, wherein said Nwell diode comprises a plurality of Nwell diodes connected in series.

* * * * *